(12) United States Patent
Cheng et al.

(10) Patent No.: US 8,487,316 B2
(45) Date of Patent: Jul. 16, 2013

(54) METHOD OF MANUFACTURING AN INTEGRATED SEMICONDUCTOR SUBSTRATE STRUCTURE WITH DEVICE AREAS FOR DEFINITION OF GAN-BASED DEVICES AND CMOS DEVICES

(75) Inventors: Kai Cheng, Leuven (BE); Stefan Degroote, Scherpenheuvel-Zichem (BE)

(73) Assignee: IMEC, Leuven (BE)

( * ) Notice: Subject to any disclaimer, the term of this patent is extended or adjusted under 35 U.S.C. 154(b) by 359 days.

(21) Appl. No.: 12/914,930

(22) Filed: Oct. 28, 2010

(65) Prior Publication Data

US 2011/0108850 A1 May 12, 2011

Related U.S. Application Data

(60) Provisional application No. 61/260,276, filed on Nov. 11, 2009.

(30) Foreign Application Priority Data

Oct. 30, 2009 (EP) ..................................... 09174721

(51) Int. Cl.
*H01L 29/04* (2006.01)
*H01L 29/15* (2006.01)
*H01L 31/036* (2006.01)

(52) U.S. Cl.
USPC ................. 257/75; 257/70; 438/44; 438/429; 438/200

(58) Field of Classification Search
USPC ..................... 257/E21.09, E27.059, E21.615, 257/76, 614, 615, 183, 200, 204, 66, 69, 257/70, 64, 510, 522, 75, 397, 466, 513, 257/521, 586, 594, 618, 622; 438/478, 479, 438/758, 200, 429, 455, 456, 445, 421, 619, 438/430, 422, 226, 319, 294, 413, 584, 222, 438/357, 360

See application file for complete search history.

(56) References Cited

U.S. PATENT DOCUMENTS 4,910,165 A * 3/1990 Lee et al. ........................ 438/409
5,064,781 A 11/1991 Cambou et al.

(Continued)

FOREIGN PATENT DOCUMENTS

JP 2007-184549 7/2007
WO WO 2006/138378 12/2006

(Continued)

OTHER PUBLICATIONS

Shichijo, et al., Monolithic Process for Co-integration of GaAs MESFET and Silicon CMOS Devices and Circuits, IEEE Transactions on Electron Devices, vol. 37 No. 3, Mar. 1990, p. 540-555.

(Continued)

*Primary Examiner* — Ha Nguyen
*Assistant Examiner* — Thanh Y Tran
(74) *Attorney, Agent, or Firm* — Knobbe Martens Olson & Bear LLP

(57) ABSTRACT

An integrated semiconductor substrate structure is disclosed. In one aspect, the structure includes a substrate, a GaN-heterostructure and a semiconductor substrate layer. The GaN heterostructure is present in a first device area for definition of GaN-based devices, and is covered at least partially with a protection layer. The semiconductor substrate layer is present in a second device area for definition of CMOS devices. At least one of the GaN heterostructure and the semiconductor substrate layer is provided in at least one trench in the substrate, so that the GaN heterostructure and the semiconductor substrate layer are laterally juxtaposed.

8 Claims, 4 Drawing Sheets

U.S. PATENT DOCUMENTS

| | | | |
|---|---|---|---|
| 8,173,551 B2 * | 5/2012 | Bai et al. | 438/758 |
| 2004/0012037 A1 | 1/2004 | Venkatesan et al. | |
| 2006/0003512 A1 | 1/2006 | Gonzalez et al. | |
| 2006/0284247 A1 | 12/2006 | Augustine et al. | |
| 2007/0087525 A1 * | 4/2007 | Chen et al. | 438/429 |
| 2007/0241403 A1 | 10/2007 | Thean et al. | |

FOREIGN PATENT DOCUMENTS

| | | |
|---|---|---|
| WO | WO 2007/014294 | 2/2007 |
| WO | WO 2008/036256 | 3/2008 |

OTHER PUBLICATIONS

Zhou et al., Comparison of the properties of GaN grown on complex Si-based structures, Applied Physics Letters 86, 081912 (2005), 3 pages.

European Search Report and European Search Opinion mailed on Apr. 8, 2010 in European Patent Application No. 09174721.2, filed Oct. 30, 2009.

* cited by examiner

METHOD OF MANUFACTURING AN INTEGRATED SEMICONDUCTOR SUBSTRATE STRUCTURE WITH DEVICE AREAS FOR DEFINITION OF GAN-BASED DEVICES AND CMOS DEVICES

CROSS REFERENCE TO RELATED APPLICATIONS

This application claims priority under 35 U.S.C. §119(e) to U.S. provisional patent application 61/260,276 filed on Nov. 11, 2009, which application is hereby incorporated by reference in its entirety.

BACKGROUND OF THE INVENTION

1. Field of the Invention

The invention relates to a method of manufacturing an integrated semiconductor substrate structure provided with a first device area for definition of GaN-based devices and a second device area for definition of CMOS devices.

The invention also relates to an integrated semiconductor substrate structure thus formed.

The invention further relates to a method of manufacturing an integrated circuit with the integrated semiconductor substrate structure.

2. Description of the Related Technology

GaN is a promising candidate for use for power applications as well as for optical applications. Examples hereof include the manufacture of light emitting diodes, power amplifiers, power converters. In order to control this type of devices, control electronics is typically needed. In order to exploit the high quality of the GaN devices and to meet the demand for functionality and for small size, integration of control electronics and the GaN devices is considered beneficial. Such integration is moreover in line with advanced developments to use a silicon substrate for the growth of a GaN heterostructure. Several substrates and several crystal orientations of the substrate have been used. Particularly, a silicon substrate with a (111) orientation has been found an interesting candidate. A major challenge in the growth of GaN on Si(111) has been the large mismatch of the in-plane thermal expansion coefficient ($5.59 \times 10^{-6}$ K−1 for GaN and $2.6 \times 10^{-6}$ K−1 for Si). This tends to lead to cracking in the GaN layer when cooling the heterostructure from the growth temperature to room temperature. This problem has been considerably reduced by using a low temperature AlN buffer layer or interlayer.

Recently, it has been found out that the use of a silicon-on-insulator (SOI) substrate leads to beneficial results. Experiments with both a (001) orientation and a (111) orientation of the device layer have been carried out. Zhou, *Applied Physics Letters* 86 (2005), 081912, reported the growth of GaN on a device layer of the SOI substrate structure with a (111) orientation. The SOI substrates were commercially prepared by SIMOX (separation by implanted oxygen) technology. The thickness of the silicon device layer and the buried dielectric layer of $SiO_2$ were 200 nm and 360 nm, respectively. The GaN layers were grown directly on this SOI substrate without any buffer layer in a MOCVD reactor using $H_2$ as the carrier gas. Prior to GaN deposition, the substrates were heated to 1100 C for 10 minutes under $H_2$ ambient to remove the native oxide from the substrate surface. Subsequently, the GaN layer was deposited at 1100 C. The crystalline quality of the GaN layer appears to be directly influenced by the Si device layer.

US20060284247 discloses the integration of AlGaN/GaN amplifiers with silicon CMOS circuits. A planarization layer of amorphous or polycrystalline silicon and a thin layer of single crystalline silicon were formed on a SiC substrate Thereafter, a GaN heterostructure comprising AlGaN and GaN layers was grown epitaxially. A protection layer of silicon nitride or silicon oxide was deposited on the GaN heterostructure. Following this, a silicon layer is bonded to the protection layer particularly in the form of an SOI substrate with its top layer bonded to the passivation layer. The SOI substrate is thereafter thinned so as to remove its handling wafer and its buried oxide. The resulting silicon device layer typically has a thickness of 50 to 200 nm. A first device area for the definition of GaN devices was defined, and the silicon is etched away in those areas. Following this, CMOS devices are fabricated on the silicon layer in a second device area, and GaN devices are fabricated on the GaN hetero structure.

It is a disadvantage of the known method that the bonding process is still delicate, and may not result in a strong bond. The known method preferably applies grooves into one or more of the layers at the bonding interface so as to remove residual gases from the interface. These grooves are particularly needed at the center of the wafer, where otherwise the bond would not be good enough. The grooves are typically at a pitch between 1 and 2 mm. This however implies that the pitches will be present within the final chip, and thus that the amount of available surface area decreases.

Furthermore, there is still a need for an annealing process to complete the bonding process. This annealing process was 175 degrees Celsius for a 4 inch wafer and it took 24-100 hours. Higher temperatures could be used, up to 1150 degrees Celsius, Moreover, such high temperatures are also needed for the definition of CMOS devices after completion of the substrate structure. The high temperature gives rise to temperature differences during cooling, leading to thermal stress. This thermal stress becomes more dramatic with increase in substrate size. The 4 inch substrate used in the prior art is not anymore representative of industrial processing of CMOS, which uses substrate sizes of 8 inch and 12 inch diameter. Diffusion of silicon into the GaN would be another result of such high temperature process. The silicon typically diffuses from silicon oxide that is typically used as bonding layer. Such diffusion of silicon tend to deteriorate the material properties of the GaN layers, and therewith also device properties such as mobility In short, the known method and device has several drawbacks and is not industrially viable.

It is therefore desirable to provide an improved device which is less sensitive to diffusion of silicon and/or oxide particles into the GaN layers.

It is also desirable to provide an improved method for the manufacture of an integrated semiconductor substrate structure on which GaN devices can be defined in a first device area and on which CMOS circuits can be defined in a second area.

It is also desirable to provide an improved method of manufacturing of a integrated circuit with both GaN and CMOS devices and to provide improved devices.

SUMMARY OF CERTAIN INVENTIVE ASPECTS

According to a first aspect of the invention, an integrated semiconductor substrate structure comprises a substrate, a GaN-heterostructure being present in a first device area for definition of GaN-based devices, which heterostructure is covered at least partially with a protection layer; and a semiconductor substrate layer being present in a second device area for definition of CMOS devices. Herein, at least one of the GaN heterostructure and the semiconductor substrate layer are provided in at least one trench in the substrate, so that the GaN heterostructure and the semiconductor substrate layer are laterally juxtaposed. This has the advantage that the integrated semiconductor substrate structure may be provided with an at least substantially planarized surface.

In one inventive aspect, the semiconductor layer is juxtaposed to the GaN heterostructure. As a result, the resulting layer stack is substantially planar, which is advantageous for the provision of an single interconnect structure based on industrially viable materials and processes, particularly such processes known from conventional CMOS processing. The juxtaposition is reached by putting at least one of the semiconductor layer and the GaN heterostructure in a trench. If the GaN heterostructure is present in the trench, this trench extends through the semiconductor layer into the underlying substrate. If the semiconductor layer is present in the trench, the trench extends through the GaN heterostructure into the substrate.

In one aspect, it is an advantage that the lateral size of the GaN hetero structure is substantially decreased. This results in significantly lower levels of thermal stress, and thus significantly lower risk for formation of cracks and voids in the GaN. Additionally, warpage of the substrate structure may be reduced by limiting the lateral size of the GaN heterostructures. In one aspect, it is one advantage that the risk of contamination is reduced. First of all, the interface area at which diffusion of species could take place is more limited. Effectively, it is limited to one or more sidewalls of the trenches. The interfacial area at the sidewalls is typically much smaller than the interfacial area between planar layers. Additionally, there is no need that the sidewall contains silicon oxide which typically gives rise to contamination of GaN. Furthermore, one may define a buffer zone along the edges of the GaN heterostructure small enough to be commercially feasible and big enough to avoid negative impact of any contamination.

Suitably, an insulating layer is present on sidewalls of the trench. Such insulating layer is an appropriate barrier against stress and against electrical effects. A suitable material is silicon oxide or silicon nitride, as deposition of such a material is well known in semiconductor processing. However, the deposition of any other layer is not excluded, such as aluminum oxide, and one may also apply a plurality of layers, such as a stack of silicon oxide, silicon nitride and silicon oxide, also known as ONO. Most suitably, the layer is provided by uniformal deposition, for instance using chemical vapor deposition.

In one embodiment, the semiconductor layer is present in the trench. This embodiment is particularly suitable in combination with the use of an SOI type substrate comprising a handling wafer, a buried insulating layer and a top layer. The trench suitably extends to the handling wafer. The semiconductor layer then is grown onto the handling wafer. This has the advantage that the handling wafer may have another crystal orientation than the top layer. The crystal orientation of the top layer will be optimized for the growth of the GaN heterostructure. The crystal orientation of the handling wafer may be chosen to be optimized for definition of CMOS devices. In addition to differences in crystal orientation, the two layers may further have a different composition, such as Si and SiC. The semiconductor layer may be grown in an epitaxial process, or deposited as an amorphous layer. In the latter case, it is preferably recrystallized in a recrystallization treatment, typically at elevated temperature as known to the skilled person. In case of recrystallization one might destroy an underlying oxide by suitable implantation, for instance with argon or nitrogen. The process of recrystallization and any aspects related thereto including treatment of underlying oxide is in itself well known in semiconductor industry.

In another embodiment, the GaN heterostructure is present in the trench. This embodiment may be applied in combination with a monocrystalline silicon substrate, for instance. Due to the absence of an oxide, the heat transfer from the GaN heterostructure into the substrate will be more effective. That is quite relevant for the operation of the device. In a most suitable implementation hereof, grooves are present at the bottom of the trench. The grooves have side faces with a crystal orientation suitable for the growth of the GaN heterostructure. In one important example, the substrate is a silicon substrate with a (100) orientation, and the exposed side faces of the grooves have the (111) orientation preferred for growth of the GaN type layers.

For clarity it is observed that in one aspect the trench used in the present invention is not limited to a rectangular shape, when seen in a perpendicular top view. It may be round, elliptical, U-shaped, L-shaped, ring-shaped so as to surround an island. The trenches may further extend as lanes across the substrate. The more elaborate shapes, such as lanes and rings appear most suitable when the semiconductor layer is present within the trench. In this manner, the lateral extension of the GaN is limited as much as possible. That is advantageous for handling purposes. In case that the GaN is shaped as an island, the island is most preferably circular, hexagonal octogonal or the like Sharp angles and/or corners extending far from the centre will be absent therewith. That is advantageous, as such sharp angles and corners are most sensitive to thermal stress.

In a further embodiment, separation lanes extending on the substrate structure are defined in the semiconductor layer. Individual integrated circuits are typically obtained from a semiconductor wafer by sawing, etching or lasering a wafer along separation or sawing lanes. The by far most common approach is sawing. Sawing however tends to generate substantial stress on the individual semiconductor circuits. Particularly cutting through an interface between a GaN-containing layer and an underlying silicon layer would generate stress that might be detrimental for yield. The present device also allows the generation of separation lanes that are free of GaN-containing layers, and preferably merely contain silicon.

A second aspect of the invention relates to a method of manufacturing an integrated semiconductor substrate structure. The integrated semiconductor substrate structure is provided with a first device area for definition of GaN-based devices and with a second device area for definition of CMOS devices. The method comprises a) providing a semiconductor substrate, b) forming a protection layer on the semiconductor substrate, which protection layer is patterned so as to expose or leave exposed the semiconductor substrate in the first device area, c) forming at least one trench into the semiconductor substrate in the first device area, d) selectively growing a GaN heterostructure in the at least one trench so as to define the first device area, using the protection layer as a mask for the selective growth, and e) removing the protection layer at least partially so as to expose the second device area.

The method of this aspect provides growth the GaN heterostructure in the one or more trenches in the semiconductor substrate. The semiconductor substrate is suitably a silicon substrate. The protection layer herein also acts as a mask to enable selective growth of the GaN heterostructure. It comprises for instance silicon oxide, which is for instance obtained by thermal oxidation of the substrate.

In one most suitable embodiment, a bottom face of the trench is etched so as to expose a crystal face with an orientation advantageous for growth of the GaN heterostructure. In this manner, use of a semiconductor layer with another orientation than the substrate is prevented. Particularly, the substrate deemed optimal for growth of GaN is silicon with a (111) orientation. Such as substrate is more expensive than standard (100) silicon and may give rise to unexpected handling problems. Preferably, a majority of the surface area at the bottom face is etched to expose the desired crystal face. More preferably, more than 70%, more than 80% or even substantially the complete surface area of the bottom face is etched. More preferably, one uses an isotropic etch so as to create grooves, such grooves including reverse pyramids. Other shapes are not excluded.

A third aspect of the invention relates to a method of manufacturing an integrated semiconductor substrate structure. The integrated semiconductor substrate structure is provided with a first device area for definition of GaN-based devices and with a second device area for definition of CMOS devices. The method comprises a) providing a semiconductor substrate, b) growing a GaN-heterostructure on the substrate, c) applying a protection layer on top of the GaN heterostructure, which protection layer is patterned so as to expose or leave exposed the GaN heterostructure in the second device area, d) providing a semiconductor substrate layer in the second device area by forming at least one trench through the GaN heterostructure to expose a substrate layer of the substrate in the second device area, e) selectively growing the semiconductor layer in the at least one trench so as to the second device area, and f) removing the protection layer at least partially to expose the first device area.

In a suitable embodiment of this method, the semiconductor substrate is an SOI substrate comprising a handling layer, a buried insulating layer and a device layer, and wherein the device layer has a crystal orientation suitable for the growth of the GaN heterostructure.

In one embodiment, the trench made into the GaN heterostructure extends to the handling layer of the SOI substrate structure. In other words, the handling layer of the SOI substrate structure is exposed when forming the trenches. This enables the growth of the semiconductor layer on the handling layer—hereinafter also called handling wafer. In a recrystallization process, the semiconductor layer can be recrystallized in an orientation identical to that of the handling wafer. This is suitable for the performance of the CMOS circuit. The device layer preferably has a (111) crystal orientation as this orientation appears best for the growth of the GaN heterostructure. However, a substrate with (111) crystal orientation, particularly a silicon substrate, is not best suited for CMOS circuits. The handling wafer typically and preferably has a (100) orientation.

In a further advantageous embodiment, an insulating layer is provided on sidewalls of the trench. Such insulating layer is an appropriate barrier against stress and against electrical effects. A suitable material is silicon oxide or silicon nitride, as deposition of such a material is well known in semiconductor processing. However, the deposition of any other layer is not excluded, and one may also apply a plurality of layers, such as a stack of silicon oxide, silicon nitride and silicon oxide, also known as ONO.

In a further embodiment, prior to growing the GaN heterostructure the device layer of the SOI substrate is patterned so as to obtain device layer islands, and wherein the GaN heterostructure is grown selectively on the device layer islands. This turns out suitable for obtaining a regular growth of the GaN heterostructure, which has a positive influence on the properties of the device layers. Suitably, the patterns in the device layer will be overgrown in a buffer layer underlying the active layers of the GaN heterostructure.

In another embodiment, the protection layer is grown in situ. The term 'growth in situ' herein refers to a process wherein a layer is grown on an underlying layer without intermediate removal from the apparatus in which the underlying layer was grown, and also without any intermediate cooling of the substrate to room temperature. Preferably, the growth temperature of the in situ grown layer is substantially the same as the growth temperature of the underlying layer. The term 'substantially the same' for instance refers to a difference of less than 200 degrees Celsius for a growth temperature between 700 and 1000 degrees Celsius. It has been found by the inventors that such in situ grown protection layer is able to protect the underlying GaN heterostructure against any temperature process that may even go beyond the decomposition temperature. Most preferably, the protection layer comprises a nitride, such as silicon nitride; this silicon nitride fits best to the structure of the underlying GaN=hetero structure.

In a further embodiment, CMOS devices are defined, at least partially, in the semiconductor substrate layer, after which at least one further layer is added to the GaN heterostructure. The further layer suitably is an indium (In)-containing layer, and is more specifically InAlN, InGaN or InAlGaN. The provision of this further layer(s) after the definition of CMOS devices into the semiconductor substrate layer is a consequence of the applied temperatures as well as the temperature stability. In-containing layers are particularly desired for the manufacture of light emitting diodes. Most preferably, the In-containing layers are provided in the form of a multi quantum well as known per se in the art. High temperature process in the definition of CMOS device typically include diffusion, implantation, recrystallization, provision of STI or LOCOS.

According to a fourth aspect of the invention, a method of manufacturing an integrated circuit is provided. This method comprises (i) providing the integrated semiconductor substrate structure according to certain inventive aspects; (ii) defining a GaN device in the first device area; (iii) defining at least one CMOS device in the second device area, and (iv) providing an interconnect structure for both the GaN device and the at least CMOS device.

In a further preferred implementation, the CMOS device manufacture is carried out in such a manner so as to keep the temperature below or equal to 1100° C. This is deemed a thermal budget that is feasible for GaN layers, particularly when provided with a protection layer, more specifically an in situ grown protection layer.

In order to interconnect the CMOS devices and GaN devices, a single interconnect structure is preferred. An interconnect structure for CMOS typically includes four or more levels. Structures with more than ten levels are made industrially. It is preferred that the interconnects of the CMOS devices and the GaN devices are kept separate up to a higher level, for instance the level which is the highest but one, or the highest. As the GaN device typically has larger dimensions than individual CMOS devices, its interconnects will have larger dimensions as well. In order to cope with such differences, particularly when using an interconnect structure including one or more so called low-K materials, one may apply one of following processes:

definition of the first interconnect level to the GaN devices in a process separate from the definition of the lower interconnect levels to the CMOS devices. When manufacturing the lower levels of the CMOS interconnect, the area of the GaN interconnect would be filled with insulating material, that is opened again in the separate process. A chemical mechanical polishing process (CMP) is used to remove superfluous metal and/or insulating material deposited on the CMOS interconnect, while making the first interconnect to the GaN devices. Alternatively, such metal deposition to prepare the GaN interconnect could be a patterned metal deposition through a mask covering the CMOS interconnect.

Definition of interconnect levels to the GaN devices simultaneously with the formation of interconnect levels to the CMOS devices, but with larger patterns, or suitably by subdivision of one vertical interconnect into a plurality of interconnects. Therewith, the dimensions in one interconnect level are kept comparable. Suitably, further dummy patterns may be added in a suitable design so that the metal density is the same or at least comparable in the CMOS interconnect and the GaN interconnect.

Use of materials such as TiN, TaN, TiW, TiWN as contact metals to the GaN heterostructure. Such materials are compatible with CMOS processing, in contrast to noble metals such as Au and Pt.

According to a fifth aspect of the invention, an integrated circuit is provided. This integrated circuit comprises a substrate; a GaN-heterostructure being present in a first device area for definition of GaN-based devices, which heterostructure is covered at least partially with a protection layer; a semiconductor substrate layer being present in a second device area for definition of CMOS devices; a GaN device defined in the first device area and a CMOS device defined in the second device area, and an interconnect structure interconnecting the CMOS devices and the GaN-based devices. Herein the integrated semiconductor substrate structure is provided with a planarized surface in that at least one of the GaN heterostructure and the semiconductor substrate layer are provided in at least one trench in the substrate, so that the GaN heterostructure and the semiconductor substrate layer are laterally juxtaposed.

DETAILED DESCRIPTION OF CERTAIN ILLUSTRATIVE EMBODIMENTS

Figure 1A:
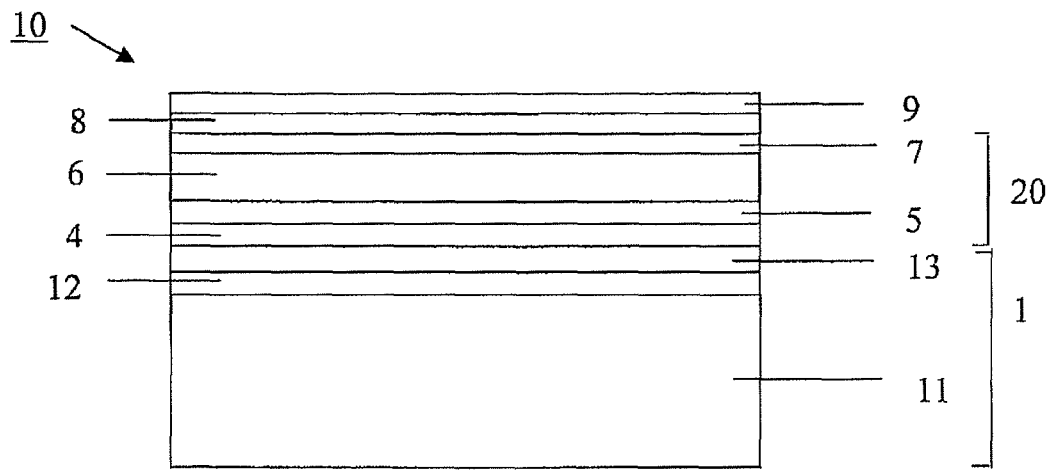
FIG. 1(a)-1(c) shows a plurality of processes in the method of manufacturing the integrated semiconductor substrate structure according to one embodiment.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the invention. Same reference numerals in different figures correspond to equal or like elements.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used herein are to be understood as being modified in all instances by the term "about." Accordingly, unless indicated to the contrary, the numerical parameters set forth herein are approximations that may vary depending upon the desired properties sought to be obtained. At the very least, each numerical parameter should be construed in light of the number of significant digits and ordinary rounding approaches.

When in the following materials or layers are mentioned without indication of the exact composition, for example SiN (also called silicon nitride or nitride) or SiO (also called silicon oxide), AlGaN, both the non-stoechiometric composition ($Si_xN_x$ or $Si_xO_y$) and the stoechiometric composition ($Si_3N_4$ or $SiO_2$) are included. The layers can also be a combination of regions with non-stoechiometric composition ($Si_xN_y$ or $Si_xO_y$) and regions with stoechiometric composition ($Si_3N_4$ or $SiO_2$). One embodiment relates to a method to fabricate group Ill-nitride field effect devices with improved characteristics. High Electron Mobility Transistors (HEMT's) are the best known example of group Ill-nitride field effect devices. The operation of group Ill-nitride field effect devices is based on the creation of a two-dimensional electron gas (2 DEG) at or near the interface between the two active layers. The 2 DEG acts as the channel of the transistor and is herein also referred to as the channel. In view of its lateral extension, the 2 DEG is also called a 2DEG layer. An active layer in group Ill-nitride field effect devices is a layer that contributes to the formation of the 2DEG. This can be for example because the layer is spontaneously or piezo-electrically polarized, or alternatively because the whole layer or part of the layer is highly doped and the free electrons diffuse into the 2DEG layer. The 2DEG layer, i.e. the channel of the transistor, is located in an active layer or at the interface between two active layers. An active layer is intrinsic to the transistor effect.

The figures are not drawn to scale and merely intended for illustrative purposes. Equal reference numerals in different figures refer to like components.

One embodiment relates to a method of integrating both CMOS circuits and GaN devices into a single integrated circuit. This integration has been found to be problematic, even though a silicon substrate is typically used as a carrier for the growth of group III-nitride layers and the processing of GaN devices. The silicon substrate used as a carrier for GaN growth has however another crystal orientation than the silicon substrate suitable for CMOS circuits. The prior art therefore has proposed stacking of silicon layers on top of a layer stack of GaN containing layers. As explained above, this stacking method is considered unhandy and moreover leads to problems when desiring to provide a single interconnect structure for both the GaN devices and the CMOS circuits.

It is observed for clarity that in the context of the present application, the terms 'group III-nitride layers' and GaN-containing layers are typically used as synonyms. Specifically, the term 'GaN-containing layer' is specifically to include complex compounds such as InGaN and AlGaN. The term 'GaN-heterostructure' is to refer to a multilayer structure comprising typically at least one layer of GaN. Typically the GaN heterostructure comprises a nucleation layer, at least one buffer layer and a first and a second active layer. Typically, one uses an AlN nucleation layer. The at least one buffer layer may comprise AlGaN, wherein the Ga-content is suitably increased during growth, gradually or stepwise. The protection layer present on top of the structure is suitably a silicon nitride layer that is provided in situ. The resulting heterostructure is suitable for the definition of transistors, light emitting diodes or other semiconductor devices.

The term heterostructure as used within the present application essentially refers to a plurality of layers. It is not necessary that a heterostructure comprises all layers needed to obtain a properly operating semiconductor device. Particularly in the case of devices containing In-containing layers, such as InAlN or InGaN, the term heterostructure typically refers to a partial structure. That is due thereto that the In-containing layers are suitably provided (grown or deposited) at temperatures lower than needed for the definition of CMOS devices in the semiconductor substrate layer. It is then more beneficial to apply those only after definition of the CMOS device.

In one embodiment, a method of manufacturing an integrated semiconductor substrate structure is provided in which the semiconductor material is provided in a trench defined within the layer stack of group-III nitride layers.

Figure 1B:
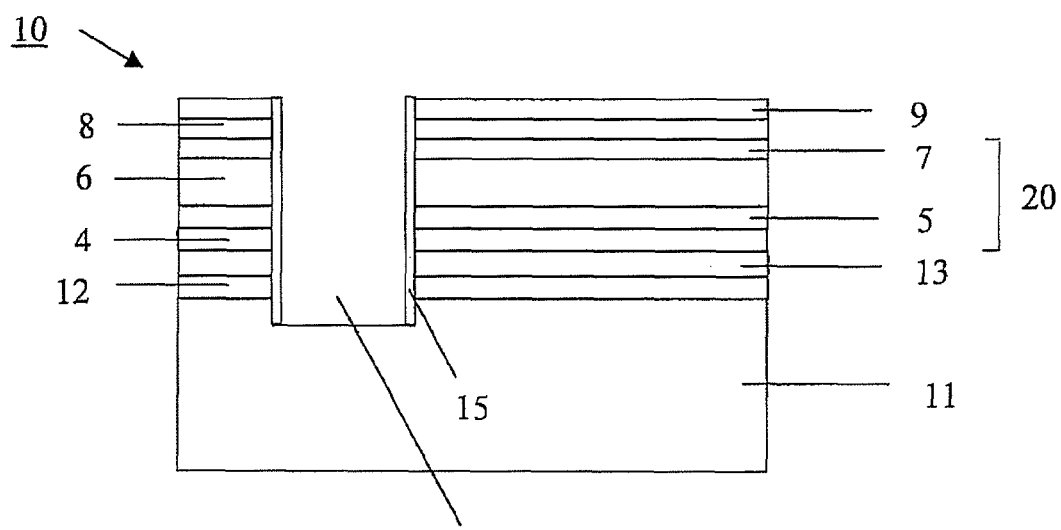
Figure 1C:
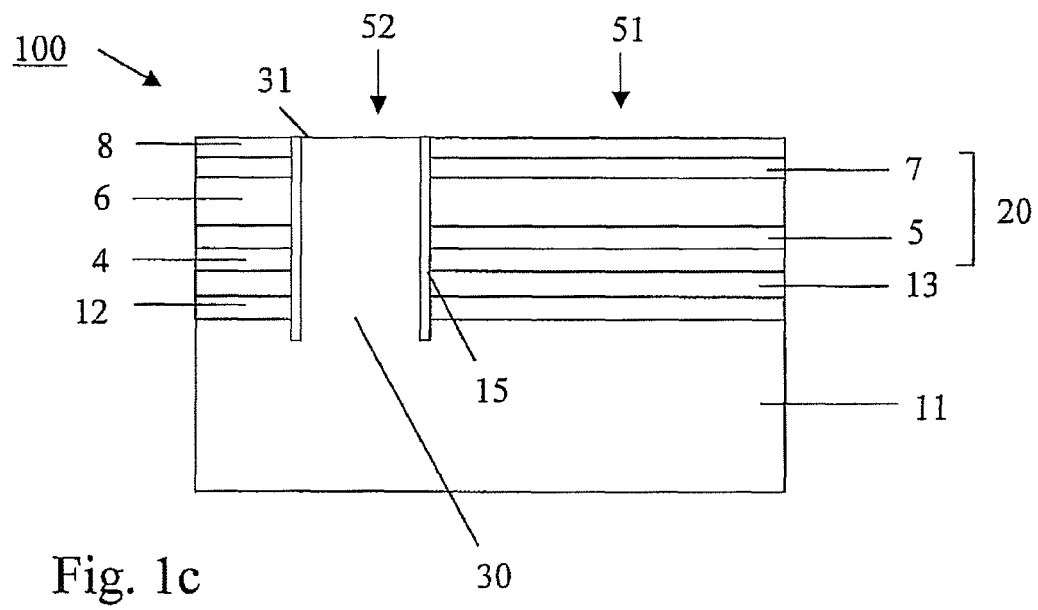

FIG. 1a-c shows in a diagrammatical cross-sectional view four stages in the manufacture of the integrated semiconductor substrate structure 100.

In a first process, shown in FIG. 1a, a plurality of layers is provided on top of a semiconductor substrate 1. The semiconductor substrate 1 used in this embodiment is a silicon-on-insulator (SOI) type substrate 1 comprising a handling layer or handling wafer 11, a buried insulating layer 12 and a device layer 13. The device layer 13 is chosen so as to enable growth of GaN-containing layers. Suitably, it is a monocrystalline silicon substrate with a (111) crystal orientation. The buried insulating layer 12 is typically silicon oxide, though other materials such as silicon nitride or a combination of silicon nitride and silicon oxide are not excluded. The handling wafer 11 is suitably a silicon substrate with a (100) crystal orientation. This orientation is commonly used in semiconductor processing. The handling wafer is suitably a monocrystalline silicon substrate.

The GaN-heterostructure 20, hereinafter also referred to as layer stack 20 typically comprises a plurality of group III-nitride layers. As a minimum, a first active layer 6 and a second active layer 7 are needed, as the channel of the GaN device is formed at an interface of this first and second active layer. This channel is also referred to as a two-dimensional electron gas (2-DEG), or a 2-DEG layer. A first active layer of GaN and a second active layer of AlGaN are needed for a transistor (HEMT). A layer stack of a zeroth layer of AlGaN, a first layer of GaN and a second layer of AlGaN, InGaN or a combination thereof is typical for a specific HEMT known as double hetero field effect transistor (DH-FET). In the latter case, the thickness of the first active layer of GaN is substantially reduced in comparison with a conventional HEMT, for instance to 100-200 nm. These active layers are typically grown on a nucleation layer 4 and at least one buffer layer 5, suitably comprising AlGaN. The structure may be covered with AlN and with a protection layer of SiN 8.

A first active layer of InGaN and a second active layer of GaN are deemed beneficial for a light emitting diode. Most suitably, the light emitting diode comprises a quantum well. Such a quantum well comprises for instance at least one layer of GaN or InGaN and at least one layer of InAlN. The quantum well may be a single quantum well (a single layer of each) or a multiple quantum well (a plurality of layers of each, advantageously as a stepped structure). The multiple quantum well, also known as multiquantum well, is preferred. The quantum well is suitably provided on top of a heterostructure comprising a nucleation layer, at least one buffer layer and a GaN-layer. Such GaN is then preferably n-doped through the introduction of Si atoms. The definition of the layer stack is known per se to the skilled person in the art of GaN device definition. The layers of the layer stack 20 are typically grown epitaxially.

A passivation layer 8 is present on top of the layer stack 20. Preferably this passivation layer comprises at least an electron donating element and nitrogen, for example is a SiN passivation layer or a thin in-situ SiN passivation layer (4). The SiN can be non-stoechiometric SixNy or stoechiometric Si3N4 or a combination of both stoechiometric Si3N4 and non-stoechiometric SixNy. In the best case this SiN is stoechiometric Si3N4. The thickness of the passivation layer, for example SiN, can vary between about 1 nm and 5000 nm, even better between about 2 nm and 10 nm, even better between about 3 nm and 5 nm. This can be done by MOCVD according to EP1612866 (which is incorporated herein by reference) or by any other method known in the field. The SiN layer can be deposited with Metal Organic Chemical Vapor Deposition (MOCVD), for example. Preferably the SiN has a high quality, meaning a limited number of defects. Preferably, the SiN is deposited in-situ, and in the best case before cooling down the device. With 'in situ' is meant that the passivation layer is applied in the same deposition tool, in the best case before cooling down the device, for example by depositing the passivation layer 8 in the same reaction chamber as the deposition of the first and second active layer 6, 7.

It has been found in experiments leading to one embodiment, that the provision of a passivation layer in situ leads to beneficial results when intending to combine CMOS circuits and GaN devices. It has turned out that the presence of this in-situ deposited SiN passivation layer 8, the surface of the layer stack 20 demonstrates an appropriate stability at very high temperatures, e.g. temperatures above about 1100 degrees Celsius. The thickness of in-situ deposited silicon nitride can be in the range of about 1 monolayer (~0.2 nanometer) to at least 1 micrometer. When the in-situ deposited silicon nitride 8 has a thickness in the scale of nanometers, another dielectric layer is suitably deposited thereon. Suitable examples of such dielectric layers include silicon oxide, and non-stoechiometric silicon nitride. In the embodiment shown in FIG. 1a, a further dielectric layer is provided. This further dielectric layer 9 functions as an etch mask in the following process of the method.

FIG. 1b shows the integrated semiconductor substrate structure at a second stage of the processing. Herein, the structure 100 is shown after the provision of a trench 14. In this example, the trench 14 extends through the layer stack 20, through the device layer 13 and through the buried insulating device 12. It even extends into the handling wafer 11. Even though this is considered highly beneficial, this is not strictly necessary. The bottom of the trench 14 could for instance be the top of the buried insulating layer 12, or the top of the device layer 13. Before proceeding to a next process, an insulating layer 15 may be generated inside the trench 14. This generation may be the result of a suitable treatment, such as a heat treatment or a plasma treatment. It may alternatively be the result of a deposition process, preferably by means of chemical vapor deposition. The provision of an insulator 15 enables adequate isolation between the layer stack 20 of GaN layers and the semiconductor layer to be formed within the trench 14. The insulation may be beneficial not merely for thermal reasons, but also for electrical reasons, e.g. due to doping levels and inherent charges, the layer stack 20 may be at another voltage in operation than the semiconductor layer. An insulator 15 further is effective to prevent diffusion of atoms from the layer stack 20 into the semiconductor layer or vice versa during annealing or growth processes. The insulating layer is not preferred at the bottom of the trench 14. It may be removed from this bottom partially or completely with an anisotropic etch process.

FIG. 1c shows the integrated semiconductor substrate structure at a final stage of the processing. Herein, the structure 100 is shown after growing a semiconductor layer 30 selectively in the trench 14. Due to the selectively of growth of semiconductor material, growth will occur only inside the trench but not on the further dielectric layer 9. The growth process is herein shown to be continued to a level at which portions of the grown semiconductor layer 30, or the complete semiconductor layer 30 extend above the passivation layer 4. It is thereafter planarized for instance with a chemical-mechanical polishing treatment as known in the art to result in a planarized surface 31. The further dielectric layer 9 may be removed in the same process, or prior thereto in an etching process.

Alternatively, growth processes may be optimized so as to generate a planar top surface 31, or the growth process may be stopped at an earlier phase, after which a dielectric or insulating layer is generated on top of the semiconductor layer. The dielectric or insulating layer may then be opened locally for device definition. Since the growth of the semiconductor layer 30 typically is the fast in the center, the dielectric or insulating layer will be thicker at the edges of the trench 14. This is deemed beneficial, as it may act herein as a compliant layer to minimize stress between the layer stack 20 and the semiconductor layer 30. The semiconductor layer 30 is typically silicon, but could be any other semiconductor material, including for instance SiGe. The dielectric layer is suitably silicon oxide, silicon nitride, siliconoxynitride. It may be deposited, for instance with chemical vapor deposition, or as a low-quality oxide layer, such as pyrolithic silicon oxide (pyrox). Alternatively, the dielectric layer may be a thermal oxide, for instance by rapid thermal processing.

The semiconductor layer 30 may be grown as an amorphous, a polycrystalline or a monocrystalline layer. Most suitably, it is grown as a polycrystalline layer and thereafter recrystallized. The recrystallization process preferably takes place directly after the growth, i.e. before any planarization process and before any further layer deposition or generation. In the case that the semiconductor layer is grown on top of the buried insulating layer 12, a nucleation layer is suitably deposited prior to the growth process. Such a nucleation layer could be a semiconductor layer, but alternatively another type of material.

With the planarized surface 31, the integrated semiconductor substrate structure 100 is ready for device processing. If a device surface 31 is desired which resides below the surface of the passivation layer 8, an etching treatment may be carried out after the CMP operation. Such a treatment may also be beneficial, if a top layer of a different substrate material, i.e. SiGe or SiC is to be created on top of the semiconductor layer 30. CMOS devices may be provided in the $2^{nd}$ device area 52, while HEMT or LEDs or other heterodevices can be provided in the $1^{st}$ device area 51.

It is an advantage of the growth of the semiconductor layer into trenches in the GaN hetero structure or vice versa, that the surface of the resulting substrate structure is or can be substantially planarized. The bonding in the prior art led to the presence of a semiconductor layer on top of the passivation layer. Thus semiconductor layer was formed as the device layer of an SOI substrate, and therefore has a typical thickness in the order of about 50-200 nm. This thickness already constitutes a major engineering problem for implementing a single interconnect structure. Advanced CMOS transistors have nowadays feature sizes below about 100 nm. CMOS processes of older generations usually have critical feature size of up to approximately 200 nm. The first interconnect layer typically features corresponding lateral sizes. Layer thicknesses are typically well below such feature sizes. The GaN devices tend to be larger and thus have larger interconnects. In other words, the CMOS circuits of the prior art that present at a higher level need much finer interconnects than the GaN devices. According to one embodiment, however, the surface of the semiconductor layer in the trench will be planarized with the protection layer. Alternatively, it is defined at a level below the protection layer. Therewith, it is easier to create a single interconnect structure that is industrially viable and that follows rules and guidelines previously developed for pure CMOS circuits.

It is observed that there is no necessity to continue with device processing on the integrated semiconductor substrate structure 100 directly after its manufacture. In fact, the manufacture of the integrated semiconductor substrate structure 100 may well be carried out separately from the device processing, i.e. by a separate company.

In one suitable embodiment, trenches 14 are not merely defined in areas intended for the definition of CMOS circuits. Trenches are additionally defined in areas intended as separation lanes. Individual integrated circuits are typically obtained from a semiconductor wafer by sawing, etching or lasering a wafer along separation or sawing lanes. The by far most common approach is sawing. Sawing however tends to generate substantial stress on the individual semiconductor circuits. Particularly cutting through an interface between a GaN-containing layer and an underlying silicon layer would generate stress that might be detrimental for yield. The present method also allows the generation of separation lanes that are free of GaN-containing layers, and preferably merely contain silicon.

Figure 2:
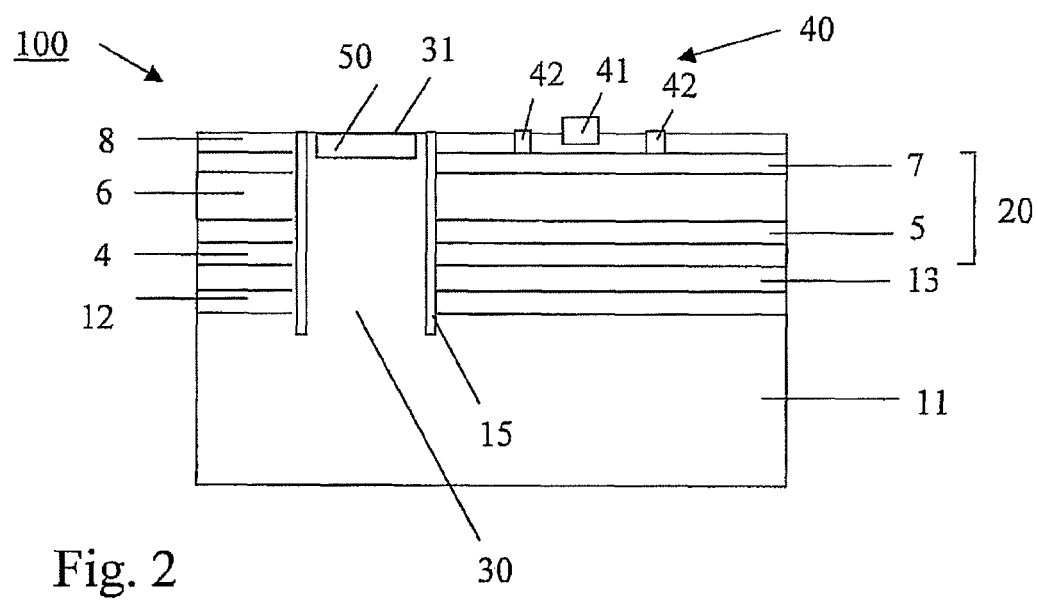
FIG. 2 shows the integrated semiconductor substrate structure according to a first embodiment.

FIG. 2 shows an integrated circuit that has been produced on the integrated semiconductor substrate structure 100. A CMOS circuit 50 has been formed at the device surface 31 of the semiconductor layer 30. A GaN device 40 has been formed on the layer stack 20. Thereto, the passivation layer 4 has been opened, and a gate electrode 41 and source and drain contacts 42 have been provided. The integrated circuit typically contains an interconnect structure, which is however not shown in the present figure.

FIG. 3*a*-*d* shows another embodiment of the method of manufacturing. Herein, the trench 14 in the substrate 1 is to be filled with the GaN material 20 to generate the first device area 51, while the substrate 1 will be used for the definition of the second device area 52. Evidently, it is not excluded that the substrate 1 is merely a template and that the second device area 52 is defined in material deposited or grown in a further trench.

Figure 3A:
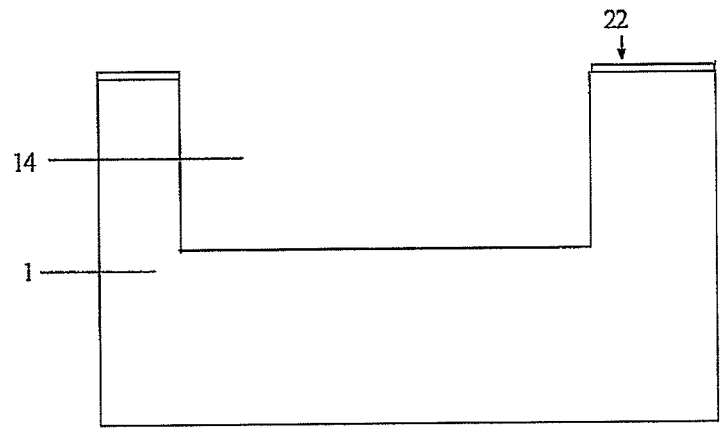
FIG. 3a-d shows the method of manufacturing the integrated semiconductor substrate structure according to a second embodiment.

FIG. 3*a* shows the result of etching a trench 14 into a silicon substrate 1. An etch mask 22 is present on the surface of the silicon substrate 1. The silicon substrate typically has a (100) orientation, e.g. it is a conventional monocrystalline silicon substrate. While this example specifically refers to a monocrystalline silicon (100) substrate, alternative substrates are not excluded.

Figure 3B:
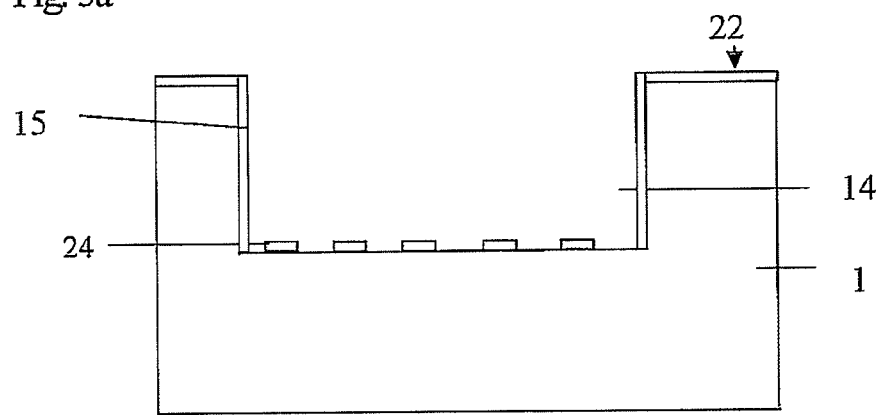

FIG. 3*b* shows the result of a second process of the method, wherein side walls of the trench 14 are covered with an insulator 15 and an etching mask 24 is applied on the bottom of the trench. Suitably, the insulator 15 and the etching mask as a single layer. Most suitably, the manufacture starts with the deposition of a resist layer that is patterned so as to define the areas at which the bottom surface of the trench is to be exposed. Thereafter, an insulating material can be deposited in the exposed portions of the surface of the trench—which include the sidewalls. Alternatively, one may provide the insulating layer on the complete trench surface, for instance by thermal oxidation, and thereafter provide an etch mask and apply dry etching.

Figure 3C:
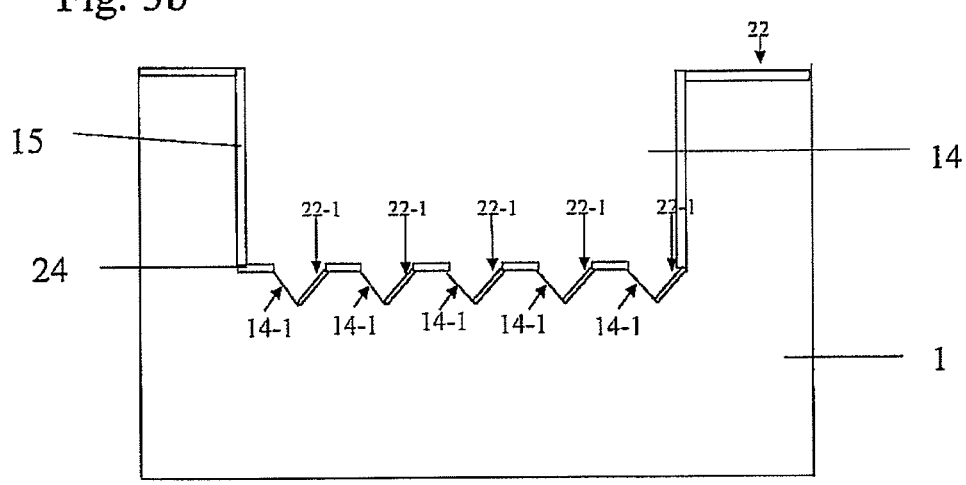

FIG. 3*c* shows a further process of the manufacture of the substrate structure according to one embodiment. Herein, an isotropic etch is carried out on the silicon substrate 1. This isotropic, wet etching results in V-shaped grooves with surfaces 14-1 and 22-1. Processing details are known per se to the skilled person. Most suitably, half of the surfaces, here indicated with 22-1, are covered again with an insulating mask, e.g. an oxide or nitride. One method of providing this is the provision of a resist mask in the trench, which is exposed at the areas of the sides 22-1. Thereafter, the mask 22-1 can be applied. It is not problematic that this mask also covers the insulating layer 15 on the sidewalls of the trench. It might even be beneficial to apply a nitride protection layer on top of the insulating layer 15, if the insulating layer is made of silicon oxide. It is not detrimental if the coverage of the sides 22-1 is not perfect; its main purpose is suppression of growth.

Figure 3D:
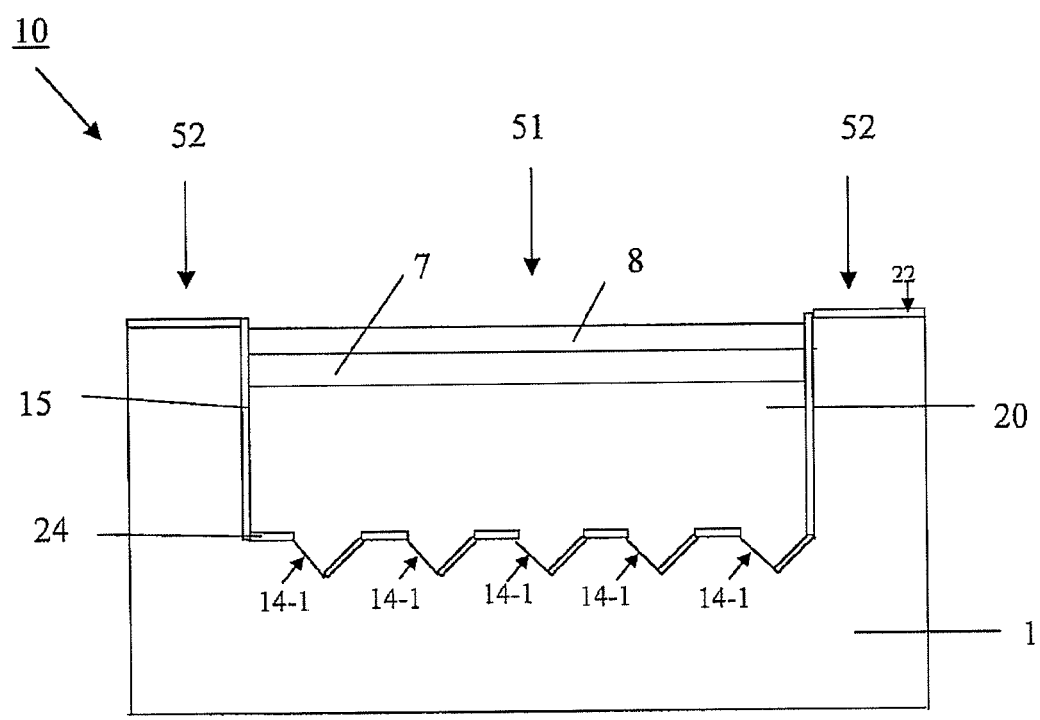

FIG. 3d shows the final stage of the manufacture of the substrate structure 100 according to this second embodiment of the invention. Now the trench 14 is filled with the layer stack 20 of AlGaN and GaN layers (here not individually shown), and on top thereof an additional cap layer 7 and a passivation layer 8. In this way, the first device area 52 is generated in the trench 14 and the second device area 51 generates adjacent thereto, on the silicon substrate 1.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. An integrated semiconductor substrate structure comprising:
   a substrate;
   a GaN-heterostructure being present in a first device area for definition of GaN-based devices, the GaN-heterostructure being covered at least partially with a protection layer; and
   a semiconductor layer being present in a second device area for definition of CMOS devices,
   wherein at least one of the GaN heterostructure and the semiconductor layer are provided in at least one trench in the substrate, so that the GaN heterostructure and the semiconductor layer are laterally juxtaposed,
   wherein the substrate is a silicon-on-insulator (SOI) substrate comprising a handling layer, a buried insulating layer and a device layer, wherein the device layer has a substrate orientation suitable for the growth of the GaN heterostructure, wherein the semiconductor layer is present on the handling layer of the silicon-on-insulator (SOI) substrate, the buried dielectric layer and the device layer having been removed in the second device area, wherein the semiconductor layer is recrystallized to have a crystal orientation identical to that of the handling layer of the silicon-on-insulator (SOI) substrate.

2. The integrated semiconductor substrate structure of claim 1, wherein an insulation layer is present between the GaN heterostructure and the semiconductor layer on at least one sidewall of the at least one trench.

3. A method of manufacturing an integrated circuit comprising providing the integrated semiconductor substrate structure of claim 1, the method further comprising:
   defining a GaN device in the first device area;
   defining at least one CMOS device in the second device area; and
   providing an interconnect structure for both the GaN device and the at least CMOS device.

4. A method of manufacturing an integrated semiconductor substrate structure provided with a first device area for definition of GaN-based devices and a second device area for definition of CMOS devices, the method comprising:
   providing a semiconductor substrate;
   growing a GaN-heterostructure on the substrate;
   applying a protection layer on top of the GaN heterostructure, the protection layer being patterned so as to expose or leave exposed the GaN heterostructure in the second device area;
   providing a semiconductor layer in the second device area, by forming at least one trench through the GaN heterostructure to expose a substrate layer of the substrate in the second device area and selectively growing the semiconductor layer in the at least one trench;
   removing the protection layer at least partially to expose the first device area; and
   recrystallizing the semiconductor layer, so that the semiconductor layer obtains a crystal orientation identical to that of the substrate layer.

5. The method of claim 4, wherein the trench is provided with at least one sidewall, the sidewall being provided with an insulating layer prior to growth of the semiconductor layer.

6. The method of claim 4, wherein a top surface of the semiconductor structure is polished after layer growth in the at least one trench.

7. An integrated circuit comprising:
   a substrate;
   a GaN-heterostructure being present in a first device area for definition of GaN-based devices, the GaN-heterostructure being covered at least partially with a protection layer;
   a semiconductor layer being present in a second device area for definition of CMOS devices;
   a GaN device defined in the first device area and a CMOS device defined in the second device area; and
   an interconnect structure interconnecting the CMOS devices and the GaN-based devices,
   wherein an integrated semiconductor substrate structure is provided with a planarized surface in that at least one of the GaN heterostructure and the semiconductor layer are provided in at least one trench in the substrate, so that the GaN heterostructure and the semiconductor layer are laterally juxtaposed,
   wherein the substrate is a silicon-on-insulator (SOI) substrate comprising a handling layer, a buried insulating layer and a device layer, wherein the device layer has a substrate orientation suitable for the growth of the GaN heterostructure, wherein the semiconductor layer is present on the handling layer of the silicon-on-insulator (SOI) substrate, the buried dielectric layer and the device layer having been removed in the second device area, wherein the semiconductor layer is recrystallized to have a crystal orientation identical to that of the handling layer of the silicon-on-insulator (SOI) substrate.

8. The integrated circuit of claim 7, wherein an insulation layer is present between the GaN heterostructure and the semiconductor layer on at least one sidewall of the at least one trench.

* * * * *

UNITED STATES PATENT AND TRADEMARK OFFICE
CERTIFICATE OF CORRECTION

Page 1 of 1

PATENT NO. : 8,487,316 B2
APPLICATION NO. : 12/914930
DATED : July 16, 2013
INVENTOR(S) : Kai Cheng et al.

It is certified that error appears in the above-identified patent and that said Letters Patent is hereby corrected as shown below:

In the Specification

Col. 2, line 15, please change "hetero structure." to --heterostructure.--.

Col. 2, line 43, please change "mobility" to --mobility.--.

Col. 3, line 19, please change "hetero structure" to --heterostructure--.

Col. 10, line 28, please change "(-0.2" to --(~0.2--.

Col. 11, line 51, please change "hetero structure" to --heterostructure--.

Signed and Sealed this
Twentieth Day of May, 2014

Michelle K. Lee
*Deputy Director of the United States Patent and Trademark Office*